US010687437B2

(12) United States Patent
Chen

(10) Patent No.: US 10,687,437 B2
(45) Date of Patent: Jun. 16, 2020

(54) FIXING BUCKLE ASSEMBLY OF SLIDE RAIL USED FOR INDUSTRIAL CABINET

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 100 days.

(21) Appl. No.: 16/174,302

(22) Filed: Oct. 30, 2018

(65) Prior Publication Data

US 2020/0137920 A1    Apr. 30, 2020

(51) Int. Cl.
*H05K 7/18* (2006.01)
*A47B 88/43* (2017.01)

(52) U.S. Cl.
CPC .......... *H05K 7/183* (2013.01); *A47B 88/43* (2017.01)

(58) Field of Classification Search
CPC ....... F16M 11/041; H05K 7/183; A47B 88/43
USPC ...... 248/221.11, 243, 244, 245, 246, 220.22, 248/220.31, 222.52, 224.8, 220.21, 248/222.11, 222.12; 312/334.4, 334.5, 312/265.1, 265.2, 265.3, 265.4, 223.1
See application file for complete search history.

(56) References Cited

U.S. PATENT DOCUMENTS

| | | | | |
|---|---|---|---|---|
| 7,357,362 B2 * | 4/2008 | Yang | ..................... | H05K 7/1489 248/220.22 |
| 7,699,279 B2 * | 4/2010 | Chen | ..................... | A47B 88/43 248/220.22 |
| 8,328,300 B2 * | 12/2012 | Yu | ..................... | A47B 88/43 312/333 |
| 8,353,494 B2 * | 1/2013 | Peng | ..................... | A47B 88/43 211/192 |
| 8,602,225 B2 * | 12/2013 | Lin | ..................... | A47B 88/43 211/26 |
| 9,237,808 B2 * | 1/2016 | Chen | ..................... | A47B 96/07 |
| 9,681,573 B2 * | 6/2017 | Chen | ..................... | H05K 7/1489 |
| 9,861,193 B2 * | 1/2018 | Chen | ..................... | H05K 7/1489 |
| 10,251,482 B2 * | 4/2019 | Chen | ..................... | A47B 57/487 |
| 10,342,336 B2 * | 7/2019 | Chen | ..................... | A47B 57/34 |
| 10,455,725 B1 * | 10/2019 | Hsu | ..................... | H05K 7/183 |
| 2001/0040203 A1 * | 11/2001 | Brock | ..................... | H02B 1/34 248/222.11 |
| 2003/0107309 A1 * | 6/2003 | Lauchner | ..................... | H05K 7/1421 312/334.5 |
| 2016/0157610 A1 * | 6/2016 | Chen | ..................... | H05K 7/1489 248/219.3 |

* cited by examiner

*Primary Examiner* — Terrell L McKinnon
*Assistant Examiner* — Michael McDuffie
(74) *Attorney, Agent, or Firm* — Fei-hung Yang

(57) ABSTRACT

A fixing buckle assembly of a slide rail used for an industrial cabinet includes a fixing frame, a plurality of fixing members, a fixing plate, a hook plate, and an elastic member. The fixing frame is mounted to an end portion of the slide rail and is reversely bent to form a mounting surface corresponding to a surface of the slide rail and has a notch adjacent to the mounting surface. The hook plate and the elastic member are sandwiched between the mounting surface and a slide space formed by the fixing plate through the fixing members. When mounted to the industrial cabinet, the two protruding posts of the fixing plate are inserted in two of buckle holes of a rack, and the hook plate is driven by the elastic member to be engaged with a back of the rack to be in a locked state.

9 Claims, 5 Drawing Sheets

FIXING BUCKLE ASSEMBLY OF SLIDE RAIL USED FOR INDUSTRIAL CABINET

FIELD OF INVENTION

The present invention is used in the field of industrial computer cabinets, and more particularly to a fixing buckle assembly of a slide rail used for an industrial cabinet that can be assembled and disassembled quickly.

BACKGROUND OF THE INVENTION

Generally, an industrial computer is installed horizontally in an industrial cabinet. The four corners of the industrial cabinet are provided with vertical racks, respectively. The opposite sides of the racks are formed with a plurality of fixing holes or screw holes that are spaced apart from each other, and then fixed by fixing blocks or fixing screws, so that the industrial computers are vertically stacked in the industrial cabinet.

Since the industrial computer must be taken out for maintenance, the above-mentioned fixing blocks or fixing screws are inconvenient and time-consuming for disassembly. A pull-out slide rail is developed accordingly, instead of the conventional installation way using the fixing blocks or fixing screws. Moreover, since the pull-out slide rail has the characteristics of extension and retraction, the slide rails of different lengths can achieve a solution when the space is insufficient through the two-stage or three-stage design. The industrial computer is pushed into the industrial computer cabinet, or the industrial computer can be selectively pulled out from the industrial computer cabinet for expansion, replacement or inspection and maintenance, which improves the convenience of subsequent maintenance greatly. In the past, the slide rails were fixed in the industrial cabinet by using fixing screws. The disassembly and assembly is relatively troublesome.

In recent years, there is a slide rail that is installed in a straddle manner. Two ends of the slide rail are provided with fixing buckle assemblies to be inserted into buckle holes of the racks. The slide rail is fixed between the racks by the weight of the industrial computer, reducing the cumbersome procedure during assembly or disassembly. In this way, the industrial computer may fall down to result in damages when it is subjected to severe vibration or the cabinet collapses. Screws may be used for improving the installation stability. However, this way will cause inconvenience in disassembly and assembly.

In view of this, in recent years, some manufacturers have developed a fixing buckle assembly having an automatic locking function. A special hook is provided to automatically lock the fixing buckle assembly after installation. There is no need to use additional screws for fixing. However, the fixing buckle assembly may be loosened due to misoperation, so it is necessary to improve the fixing buckle assembly.

SUMMARY OF THE INVENTION

In order to solve the above problem, the primary object of the present invention is to provide a fixing buckle assembly of a slide rail used for an industrial cabinet. The slide rail can be quickly secured in the industrial cabinet by providing a hook plate that is movably disposed in a fixing frame. Its linear movement can quickly perform the installation and the locking work, thereby avoiding the problem of looseness after installation due to misoperation and improving the efficiency of installation and stability greatly. The operation is more intuitive and simple.

In order to achieve the above object, a fixing buckle assembly of a slide rail used for an industrial cabinet is provided. Each of four corners of the industrial cabinet is provided with a rack. The rack is disposed vertically and has a plurality of buckle holes that are spaced apart from each other. The fixing buckle assembly is mounted to each of two ends of the slide rail so that the slide rail can be horizontally mounted between the two racks. The fixing buckle assembly comprises a fixing frame, a plurality of fixing members, a fixing plate, a hook plate, and an elastic member. A surface of the fixing frame has a plurality of first fixing holes corresponding to the slide rail for mounting one end portion of the slide rail. One end of the fixing frame is reversely bent to form a mounting surface corresponding to a surface of the slide rail. The mounting surface has a plurality of second fixing holes. The fixing frame has a notch adjacent to the mounting surface. The fixing members are inserted through the second fixing holes for performing fixing. The fixing plate is a flat structure having a first surface and a second surface. The first surface is provided with a pair of protruding posts corresponding to the buckle holes. The second surface is fixed to one side of the mounting surface through the fixing members so that the pair of protruding posts is located at an outer side of the fixing frame. The second surface is provided with an accommodating trough corresponding to one surface of the mounting surface to form a slide space after combined with the fixing frame. The slide space has an opening corresponding to the notch. The hook plate is a sheet-like structure having an L-shaped cross-section. One end of the hook plate is provided with a pair of hooks. Another end of the hook plate is provided with a limiting portion that is movably disposed in the slide space. The end having the pair of hooks of the hook plate extends out from the opening of the slide space and is located in the notch. The elastic member is disposed in the slide space. One end of the elastic member is mounted in the limiting portion to ensure an engaging force required for the hook plate to be mounted. When mounted, the protruding posts are inserted in the corresponding buckle holes, and the hook plate is driven by the elastic member to be engaged with a back of the rack to complete installation quickly.

In an embodiment, the mounting surface and the fixing frame are disposed at a 90 degree. Besides, two edges of the fixing frame are perpendicularly provided with two sidewalls relative to the slide rail, so that an accommodating space is formed between the two sidewalls for positioning and mounting the slide rail. Each of the hooks is formed with a guiding bevel corresponding to an insertion direction when the protruding posts are mounted. When the protruding posts are mounted, the guiding bevel is pushed by a push force from the rack to expand outwardly. After the push force disappears, the guiding bevel is engaged with the rack. In additional, the mounting surface has a first through hole between the two second fixing holes. The fixing plate has a second through hole between the two protruding posts. After assembled, the first through hole and the second through hole are concentrically disposed. One side of the second through hole is provided with a positioning post for receiving a part of the elastic member when mounted. It should be noted that the elastic member is a coiled spring. A center of the elastic member is formed with a coiled structure. The coiled structure is fitted and positioned on the positioning post. Two ends of the elastic member are provided with extension portions to lean against the slide space, respectively.

In an embodiment, for easy assembly, the fixing members are screws, and the fixing plate is formed with screw holes inside the protruding posts corresponding to the fixing members. Furthermore, the limiting portion is in the form of two tabs protruding from two side edges of the hook plate. The accommodating trough is provided with two limiting recesses corresponding to the limiting portion. The hook plate is limited by the limiting portion and the two limiting slots. In addition, the mounting surface is provided with a plurality of first positioning portions corresponding to the fixing plate. The fixing plate is provided with a plurality of second positioning portions. The first positioning portions are circular holes. The second positioning portions are cylindrical posts.

DETAILED DESCRIPTION OF THE PREFERRED EMBODIMENTS

Embodiments of the present invention will now be described, by way of example only, with reference to the accompanying drawings.

Figure 1:
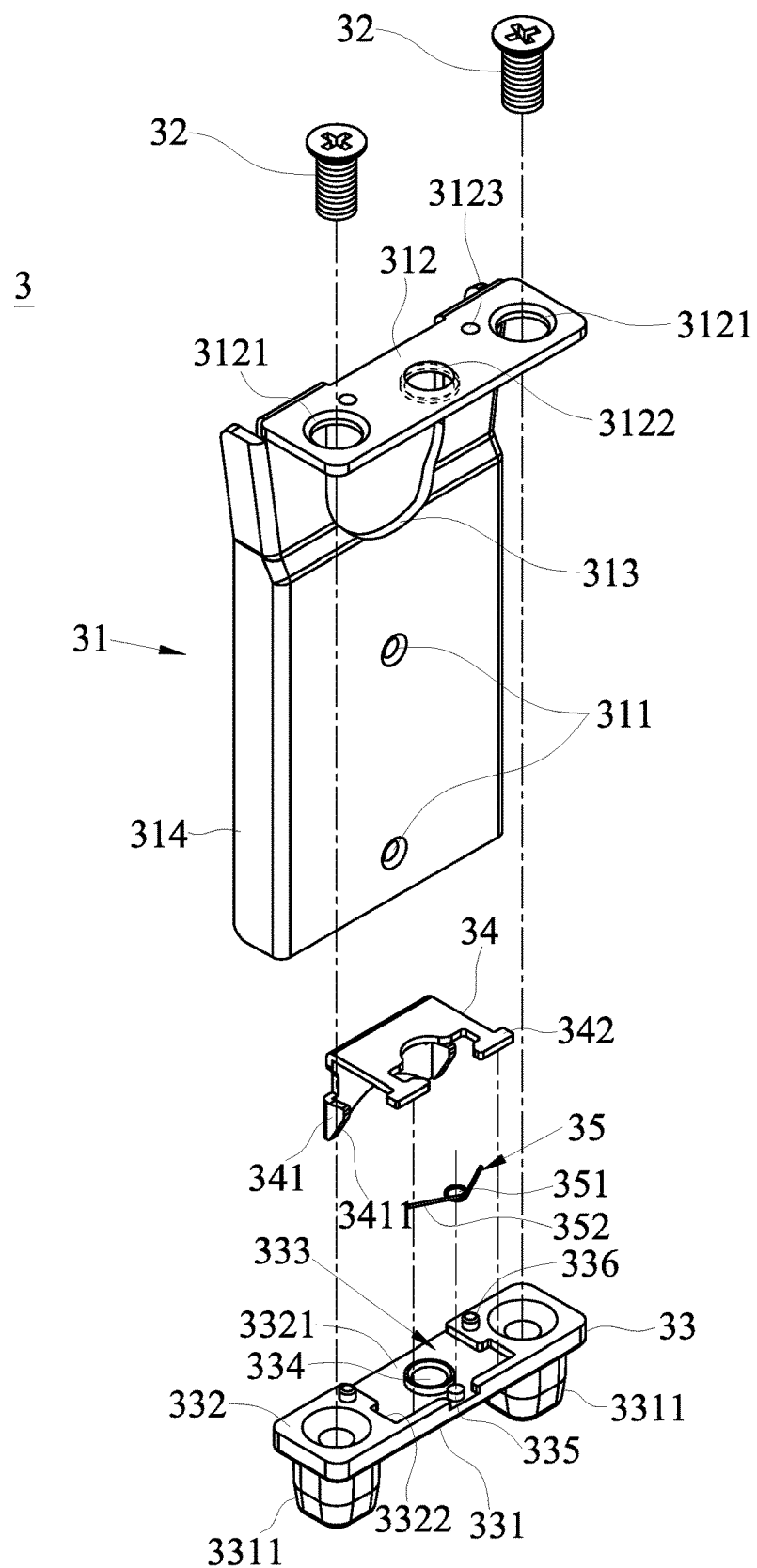
FIG. 1 is an exploded view in accordance with a preferred embodiment of the present invention.
Figure 2:
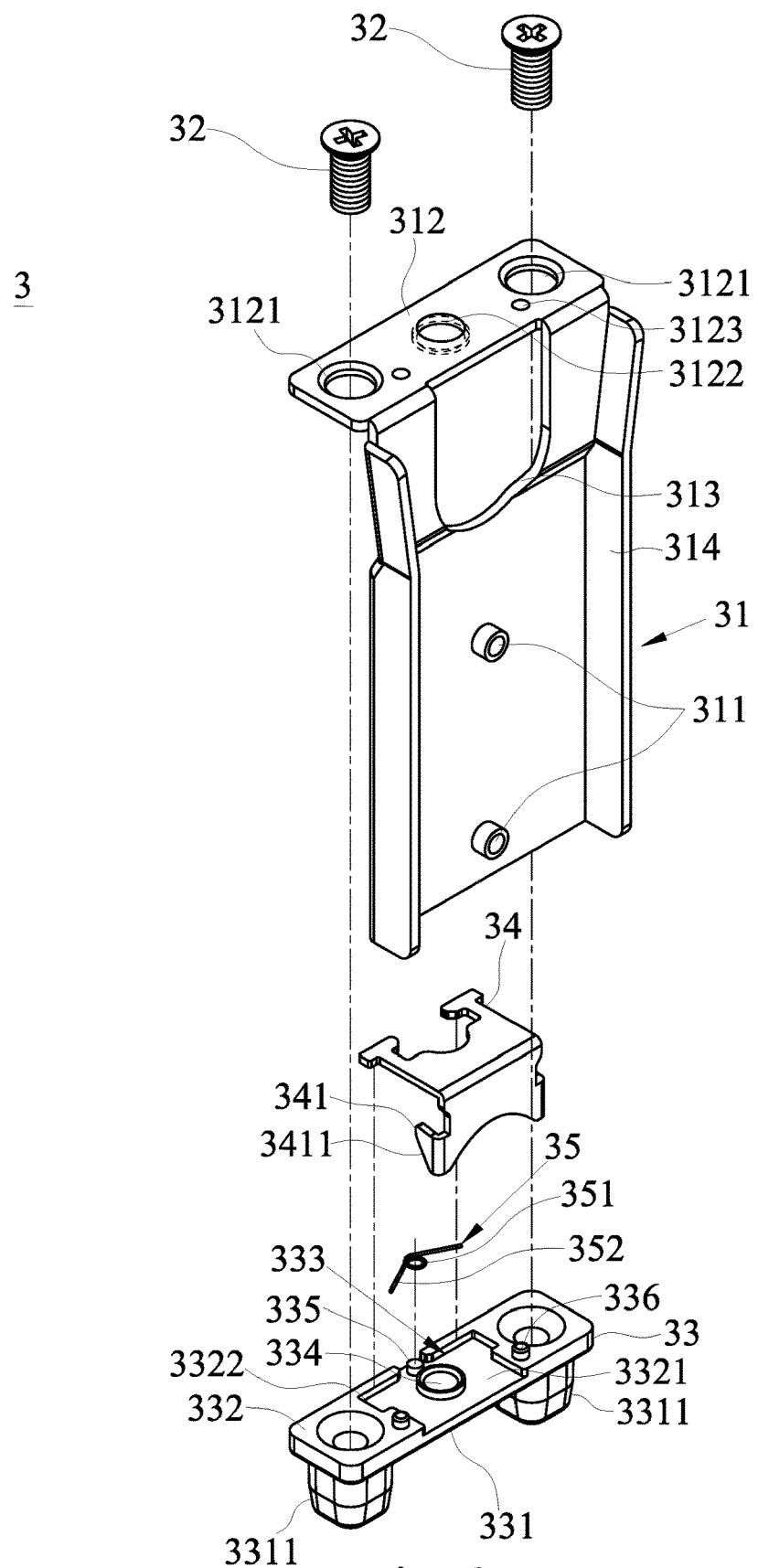
FIG. 2 is another exploded view in accordance with the preferred embodiment of the present invention.
Figure 3:
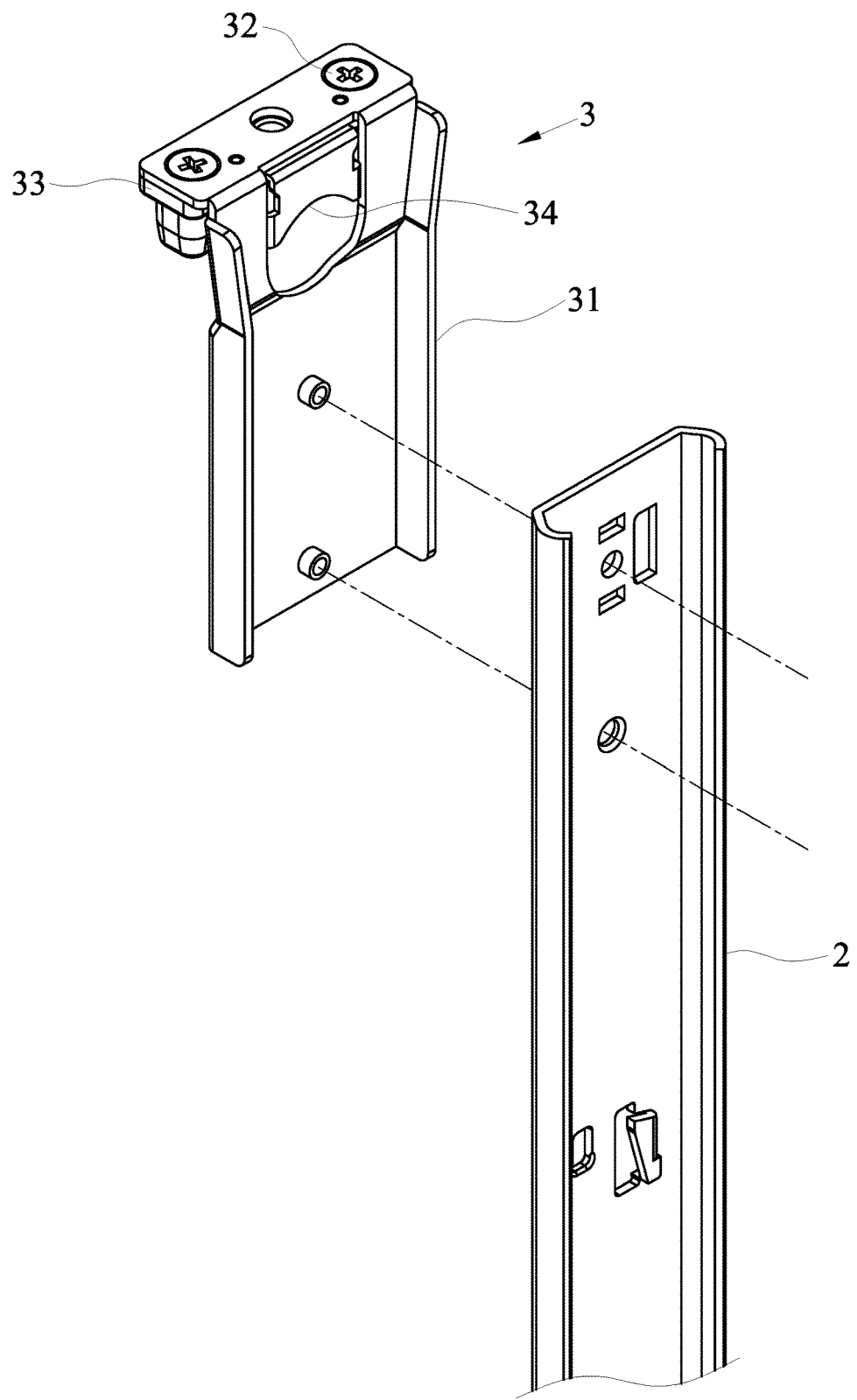
FIG. 3 is a perspective view in accordance with the preferred embodiment of the present invention after assembled.
Figure 4:
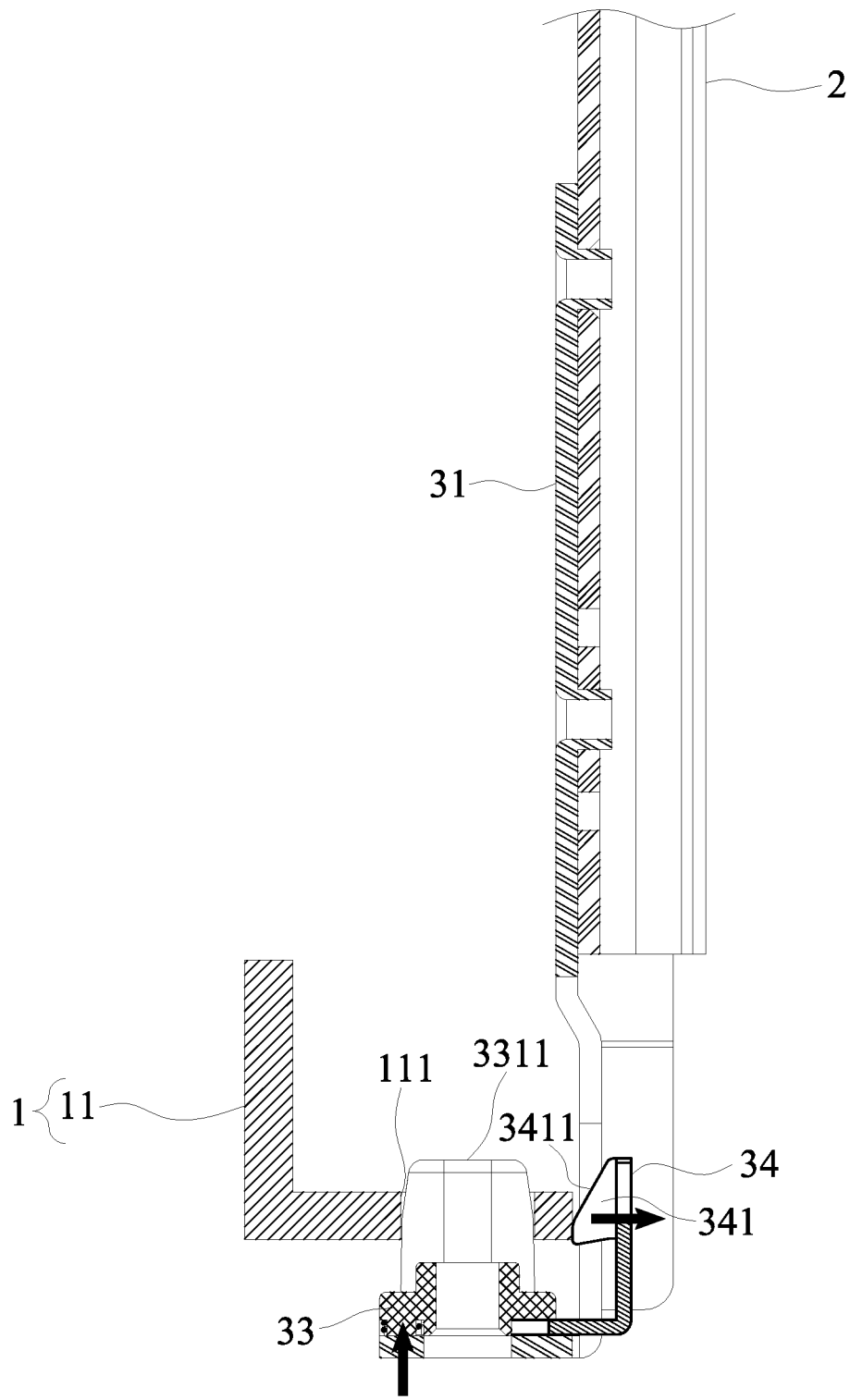
FIG. 4 is a first schematic view in accordance with the preferred embodiment of the present invention when in use.
Figure 5:
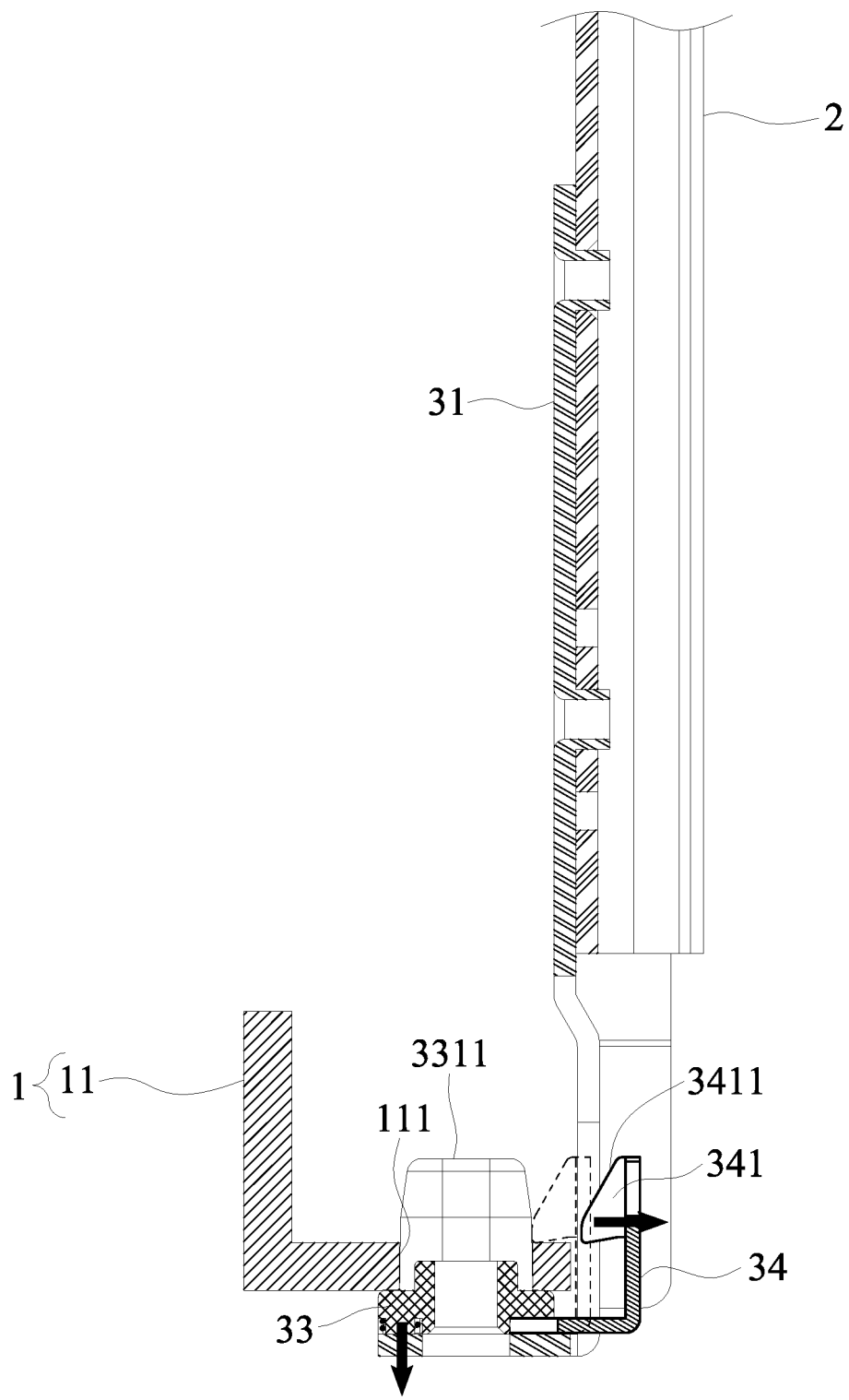
FIG. 5 is a second schematic view in accordance with the preferred embodiment of the present invention when in use.

FIG. 1 is an exploded view in accordance with a preferred embodiment of the present invention. FIG. 2 is another exploded view in accordance with the preferred embodiment of the present invention. FIG. 3 is a perspective view in accordance with the preferred embodiment of the present invention after assembled. FIG. 4 is a first schematic view in accordance with the preferred embodiment of the present invention when in use. FIG. 5 is a second schematic view in accordance with the preferred embodiment of the present invention when in use. As shown in the figures, the present invention discloses a fixing buckle assembly 3 of a slide rail 2 used for an industrial cabinet 1. Each of four corners of the industrial cabinet 1 is provided with a rack 11. The rack 11 is disposed vertically and has a plurality of buckle holes 111 that are spaced apart from each other. Two fixing buckle assemblies 3 are mounted to two ends of the slide rail 2, respectively, so that the slide rail 2 can be horizontally mounted between two racks 11. The fixing buckle assembly 3 includes a fixing frame 31, a plurality of fixing members 32, a fixing plate 33, a hook plate 34, and an elastic member 35.

The fixing frame 31 is an L-shaped structure viewed from the side. The surface of the fixing frame 31 has a plurality of first fixing holes 311 corresponding to the slide rail 2 for mounting one end portion of the slide rail 2. One end of the fixing frame 31 is reversely bent to form a mounting surface 312 corresponding to the surface of the slide rail 2. The mounting surface 312 and the fixing frame 31 are disposed at a 90 degree. The mounting surface 312 has a plurality of second fixing holes 3121. The fixing frame 31 has a notch 313 adjacent to the mounting surface 312. In addition, for the stability of the assembly, two edges of the fixing frame 31 are perpendicularly provided with two sidewalls 314 relative to the slide rail 2, so that an accommodating space is formed between the two sidewalls 314.

The fixing members 32 are screws and are inserted through the second fixing holes 3121 for performing fixing.

The fixing plate 33 is a flat structure having a first surface 331 and a second surface 332. The first surface 331 is provided with a pair of protruding posts 3311 corresponding to the buckle holes 111. The second surface 332 is fixed to one side of the mounting surface 312 through the fixing members 32, so that the pair of protruding posts 3311 is located at an outer side of the fixing frame 31. The second surface 332 is provided with an accommodating trough 3321 corresponding to one surface of the mounting surface 312 to form a slide space 333 after combined with the fixing frame 31. The slide space 333 has an opening corresponding to the notch 313. It should be noted that the fixing plate 33 is formed with screw holes inside the protruding posts 3311 corresponding to the fixing members 32.

The hook plate 34 is a sheet-like structure having an L-shaped cross-section. One end of the hook plate 34 is provided with a pair of hooks 341, and another end of the hook plate 34 is provided with a limiting portion 342 that is movably disposed in the slide space 333. The end having the pair of hooks 341 of the hook plate 34 extends out from the opening of the slide space 333 and is located in the notch 313.

The elastic member 35 is a coil spring. The center of the elastic member 35 is formed with a coiled structure 351 located in the slide space 333. One end of the elastic member 35 is mounted in the limiting portion 342 to ensure the engaging force required for the hook plate 34 to be mounted. Accordingly, when the mounting is performed, the protruding posts 3311 are inserted in the corresponding buckle holes 111, and the hook plate 34 is driven by the elastic member 35 to be engaged with the back of the rack 11 to quickly complete the installation work.

In addition, the mounting surface 312 has a first through hole 3122 between the two second fixing holes 3121, and the fixing plate 33 has a second through hole 334 between the two protruding posts 3311. After assembled, the first through hole 3122 and the second through hole 334 are concentrically disposed. One side of the second through hole 334 is provided with a positioning post 335 for receiving a part of the elastic member 35, that is, the coiled structure 351. Two ends of the elastic member 35 are provided with extension portions 352 to lean against the slide space 333, respectively.

For easy operation, each hook 341 is formed with a guiding bevel 3411 corresponding to the insertion direction when the protruding posts 3311 are mounted. Therefore, when the fixing buckle assembly 3 of the present invention is installed, the protruding posts 3311 are inserted into the buckle holes 111. During the process, the guiding bevel 3411 is pushed by the rack 11 to expand outwardly. After the push force disappears, the guiding bevel 3411 is engaged with the rack 11.

In addition, the limiting portion 342 of the present invention is in the form of two tabs protruding from two side edges of the hook plate 34, and the accommodating trough 3321 is provided with two limiting recesses 3322 corresponding to the limiting portion 342. The hook plate 34 is limited by the limiting portion 342 and the two limiting slots 3322 so as not to fall off after the assembly is completed.

For the accuracy and convenience of assembly, in the present invention, the mounting surface 312 is provided with a plurality of first positioning portions 3123 corresponding to the fixing plate 33, the fixing plate 33 is provided with a plurality of second positioning portions 336. The first positioning portions 3123 are circular holes, and the second positioning portions 336 are cylindrical posts. When the fixing plate 33 is mounted to the mounting surface 312, the second positioning portions 336 are positioned and inserted into the first positioning portions 3123, thereby avoiding misalignment.

While the invention has been described by means of specific embodiments, numerous modifications and variations could be made thereto by those skilled in the art without departing from the scope and spirit of the invention set forth in the claims.

What is claimed is:

1. A fixing buckle assembly of a slide rail used for an industrial cabinet, each of four corners of the industrial cabinet being provided with a rack, the rack being disposed vertically and having a plurality of buckle holes that are spaced apart from each other, the fixing buckle assembly being mounted to each of two ends of the slide rail so that the slide rail can be horizontally mounted between the two racks, the fixing buckle assembly comprising:

a fixing frame, a surface of the fixing frame having a plurality of first fixing holes corresponding to the slide rail for mounting one end portion of the slide rail, one end of the fixing frame being reversely bent to form a mounting surface corresponding to a surface of the slide rail, the mounting surface having a plurality of second fixing holes, the fixing frame having a notch adjacent to the mounting surface;

a plurality of fixing members, the fixing members being inserted through the second fixing holes for performing fixing;

a fixing plate, the fixing plate being a flat structure having a first surface and a second surface, the first surface being provided with a pair of protruding posts corresponding to the buckle holes, the second surface being fixed to one side of the mounting surface through the fixing members so that the pair of protruding posts is located at an outer side of the fixing frame, the second surface being provided with an accommodating trough corresponding to one surface of the mounting surface to form a slide space after combined with the fixing frame, the slide space having an opening corresponding to the notch;

a hook plate, the hook plate being a sheet-like structure having an L-shaped cross-section, one end of the hook plate being provided with a pair of hooks, another end of the hook plate being provided with a limiting portion that is movably disposed in the slide space, the end having the pair of hooks of the hook plate extending out from the opening of the slide space and being located in the notch; and an elastic member, the elastic member being disposed in the slide space, one end of the elastic member being mounted in the limiting portion to ensure an engaging force required for the hook plate to be mounted; when mounted, the protruding posts being inserted in the corresponding buckle holes, the hook plate being driven by the elastic member to be engaged with a back of the rack.

2. The fixing buckle assembly of the slide rail as claimed in claim 1, wherein the mounting surface and the fixing frame are disposed at a 90 degree.

3. The fixing buckle assembly of the slide rail as claimed in claim 1, wherein two edges of the fixing frame are perpendicularly provided with two sidewalls relative to the slide rail, so that an accommodating space is formed between the two sidewalls.

4. The fixing buckle assembly of the slide rail as claimed in claim 1, wherein each of the hooks is formed with a guiding bevel corresponding to an insertion direction when the protruding posts are mounted, when the protruding posts are mounted, the guiding bevel is pushed by a push force from the rack to expand outwardly, after the push force disappears, the guiding bevel is engaged with the rack.

5. The fixing buckle assembly of the slide rail as claimed in claim 1, wherein the fixing members are screws, and the fixing plate is formed with screw holes inside the protruding posts corresponding to the fixing members.

6. The fixing buckle assembly of the slide rail as claimed in claim 1, wherein the mounting surface has a first through hole between the second fixing holes, the fixing plate has a second through hole between the two protruding posts, after assembled, the first through hole and the second through hole are concentrically disposed.

7. The fixing buckle assembly of the slide rail as claimed in claim 6, wherein one side of the second through hole is provided with a positioning post corresponding to the elastic member, a coiled structure formed at a center of the elastic member is fitted and positioned on the positioning post, and two ends of the elastic member are provided with extension portions to lean against the slide space, respectively.

8. The fixing buckle assembly of the slide rail as claimed in claim 1, wherein the limiting portion is in the form of two tabs protruding from two side edges of the hook plate, the accommodating trough is provided with two limiting recesses corresponding to the limiting portion, and the hook plate is limited by the limiting portion and the two limiting slots.

9. The fixing buckle assembly of the slide rail as claimed in claim 1, wherein the mounting surface is provided with a plurality of first positioning portions corresponding to the fixing plate, the fixing plate is provided with a plurality of second positioning portions, the first positioning portions are circular holes, and the second positioning portions are cylindrical posts.

* * * * *